United States Patent
Chiu et al.

(10) Patent No.: US 9,577,593 B2
(45) Date of Patent: Feb. 21, 2017

(54) IMPLICIT FEED-FORWARD COMPENSATED OP-AMP WITH SPLIT PAIRS

(71) Applicant: THE BOARD OF REGENTS, THE UNIVERSITY OF TEXAS SYSTEM, Austin, TX (US)

(72) Inventors: Yun Chiu, Allen, TX (US); Bo Wu, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 32 days.

(21) Appl. No.: 14/253,377

(22) Filed: Apr. 15, 2014

(65) Prior Publication Data

US 2015/0295551 A1 Oct. 15, 2015

(51) Int. Cl.
- H03F 3/45 (2006.01)
- H03F 1/08 (2006.01)
- H03F 3/21 (2006.01)

(52) U.S. Cl.
CPC .......... *H03F 3/45179* (2013.01); *H03F 1/086* (2013.01); *H03F 3/211* (2013.01); *H03F 3/4565* (2013.01); *H03F 3/45183* (2013.01); *H03F 3/45188* (2013.01); *H03F 3/45237* (2013.01); *H03F 2200/153* (2013.01); *H03F 2200/408* (2013.01); *H03F 2203/45116* (2013.01); *H03F 2203/45222* (2013.01);
(Continued)

(58) Field of Classification Search
CPC .................................................. H03F 3/45547
USPC ........................................ 330/253, 258, 295
See application file for complete search history.

(56) References Cited

U.S. PATENT DOCUMENTS

| 7,202,746 B1 | 4/2007 | Kejariwal et al. |
| 7,633,338 B1 | 12/2009 | Aram |

(Continued)

FOREIGN PATENT DOCUMENTS

| EP | 0499308 B1 | 1/1996 |
| WO | 02071599 A1 | 9/2002 |

OTHER PUBLICATIONS

Balaguer, Claude; Notification of Transmittal of the International Search Report and the Written Opinion of the International Searching Authority, or the Declaration; PCT/US2015/025934; date of mailing Aug. 3, 2015; 14 pages.

(Continued)

*Primary Examiner* — Khanh V Nguyen
*Assistant Examiner* — Khiem Nguyen
(74) *Attorney, Agent, or Firm* — Dickinson Wright, PLLC; Ross Spencer Garsson

(57) ABSTRACT

Disclosed are systems implementing an implicit Feed-Forward Compensated (FFC) op-amp, where the main FFC port is realized by the P-side of the CMOS input structure of the 2nd and 3rd stages of the op-amp, while the main signal path is through the N-side. According to some embodiments, to balance the relative strengths of the main path and feed-forward paths, the 2nd-stage NMOS input pair is split into two pairs, one is used to route the main path while the other is used for auxiliary FFC. The disclosed implicit FCC op-amp is unconditionally stable with adequate phase lead. According to some embodiments, the disclosed op-amp, which may be a wide-band op-amp, can be used in highly linear applications operative at intermediate frequency (IF), such as signal buffers for high-performance data converters or radio-frequency (RF) modulators and demodulators, continuous-time (CT) filters or sigma-delta data converters.

17 Claims, 5 Drawing Sheets

(52) U.S. Cl.
CPC ............. *H03F 2203/45236* (2013.01); *H03F 2203/45418* (2013.01); *H03F 2203/45481* (2013.01)

(56) References Cited

U.S. PATENT DOCUMENTS

2010/0283545 A1 11/2010 Shibata
2012/0063519 A1 3/2012 Oliaei

OTHER PUBLICATIONS

Saxena, Vishal, et al.; Systematic Design of Three-Stage Op-amps Using Split-Length Compensation; Electrical and Computer Engineering Department, Boise State University, Boise, Idaho 83725-2075; IEEE, 2011, 4 pages.
Gadde, Venkata Veera Satya Sair; Filter Design Considerations for High Performance Continuous-Time Low-Pass Sigma-Delta ADC; Dec. 2009; 122 pages; NPL 1.
Ziazadeh, Ramsin M.; Design of High-Performance Operational Amplifiers using an Embedded; Dec. 1997; 188 pages; NPL 2.
Saxena, Vishal; Indirect Feedback Compensation Techniques for Multi-Stage Operational Amplifiers; Oct. 2007; 209 pages; NPL 3.
Baker, R. Jacob; and Saxena, Vishal; High Speed Op-amp Design: Compensation and Topologies for Two and Three Stage Designs; Jan. 2013; 58 page; NPL 4.
Szczepanski, S.; and Koziel, S.; Phase Compensation Scheme for Feed Forward Linearized CMOS Operational Transconductance Amplifier; 2004; 8 pages; pp. 141-148; NPL 5.
Thandri, Bharath Kumar; and Silva-Martinez, Jose; An Overview of Feed-Forward Design Techniques for High-Gain Wideband Operational Transconductance Amplifiers; Sep. 2006; 21 pages; NPL 6.

FIG. 2
FIG. 2A
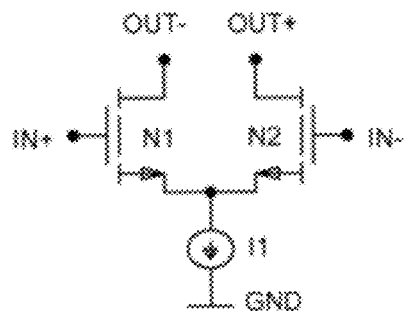
FIG. 2B
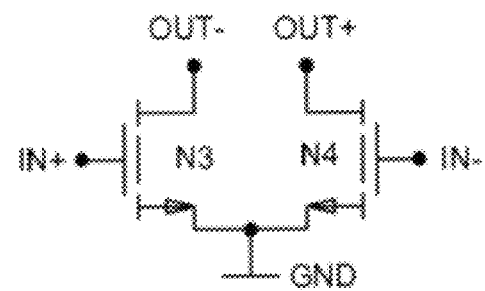
FIG. 2C
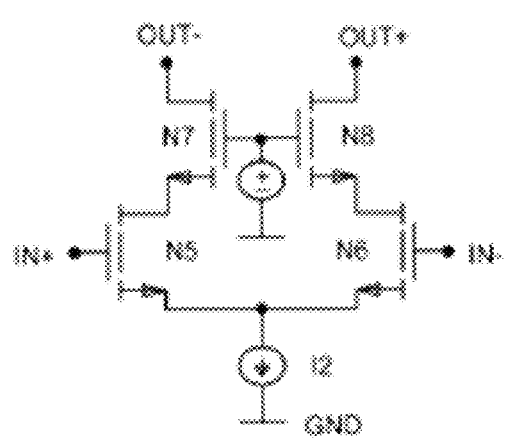
FIG. 2D
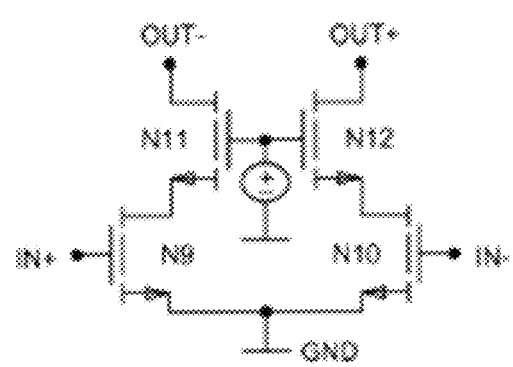
FIG. 2E
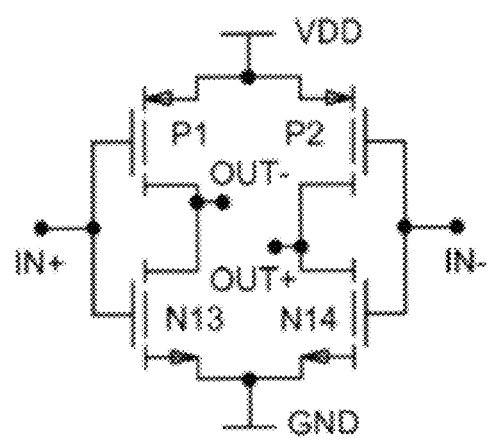

IMPLICIT FEED-FORWARD COMPENSATED OP-AMP WITH SPLIT PAIRS

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present disclosure is generally related to multiple-stage operational amplifiers, and more particularly, for an implicit feed-forward compensation technique for operational amplifiers with split pairs to achieve high gain and desired phase margin simultaneously while drawing small current.

RELATED ART

Many different kinds of circuits utilize operational amplifiers to achieve desired functionality. For example, application circuits utilize operational amplifiers arranged in feedback configurations (e.g., negative or positive) to realize a predetermined gain or other mathematical functions over a selected frequency range. To prevent instability when used in such feedback configurations, operational amplifiers typically include some frequency compensation scheme, whereby the phase shift of the feedback signal is tailored to prevent constructive interference with the input that, otherwise, would induce unwanted oscillations.

Conventional compensation techniques may not provide enough loop gain at low frequencies for some applications, especially if implemented in reduced-scale semiconductor technologies, such as nanometer gate-length CMOS processes. Moreover, extending such architecture to more than two stages, to increase the loop gain, typically results in a high degree of phase lag (e.g., 270° or more at the output), which presents stability concerns.

SUMMARY

The present disclosure remedies the failings in the art by providing for a multi-stage feed-forward operational amplifier that is more efficient from size and power perspectives, and also achieves high loop gain and stability performance. The present disclosure provides an implicit feed-forward compensation technique for operational amplifiers with split pairs to achieve high gain and desired phase margin simultaneously while drawing small current. The present disclosure provides systems implementing an implicit Feed-Forward Compensated (FFC) op-amp, where the main FFC port is realized by the P-side of the CMOS input structure of the second and third stages of the op-amp, while the main signal path is through the N-side. According to some embodiments, to balance the relative strengths of the main path and feed-forward paths, the $2^{nd}$-stage NMOS input pair is split into two pairs, one is used to route the main path while the other is used for auxiliary FFC. The disclosed implicit FCC op-amp is unconditionally stable with adequate phase lead. According to some embodiments, the disclosed op-amp, which may be a wide-band op-amp, can be used in highly linear applications operative at intermediate frequency (IF), such as signal buffers for high-performance data converters or radio-frequency (RF) modulators and demodulators, continuous-time (CT) filters or sigma-delta data converters.

The principles of the present disclosure can be embodied in varying techniques, as discussed in more detail below. Thus, it should be understood that the various embodiments of the present disclosure may include some, all, or none of the enumerated technical advantages. In addition, other technical advantages of the present disclosure may be readily apparent to one skill in the art from the figures, description and claims included herein.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure:

FIGS. 2A, 2B, 2C, 2D and 2E illustrate circuit schematics depicting transistor configurations of stages of a multi-stage amplifier according to some embodiments of the present disclosure;

DESCRIPTION OF EMBODIMENTS

Figure 1:
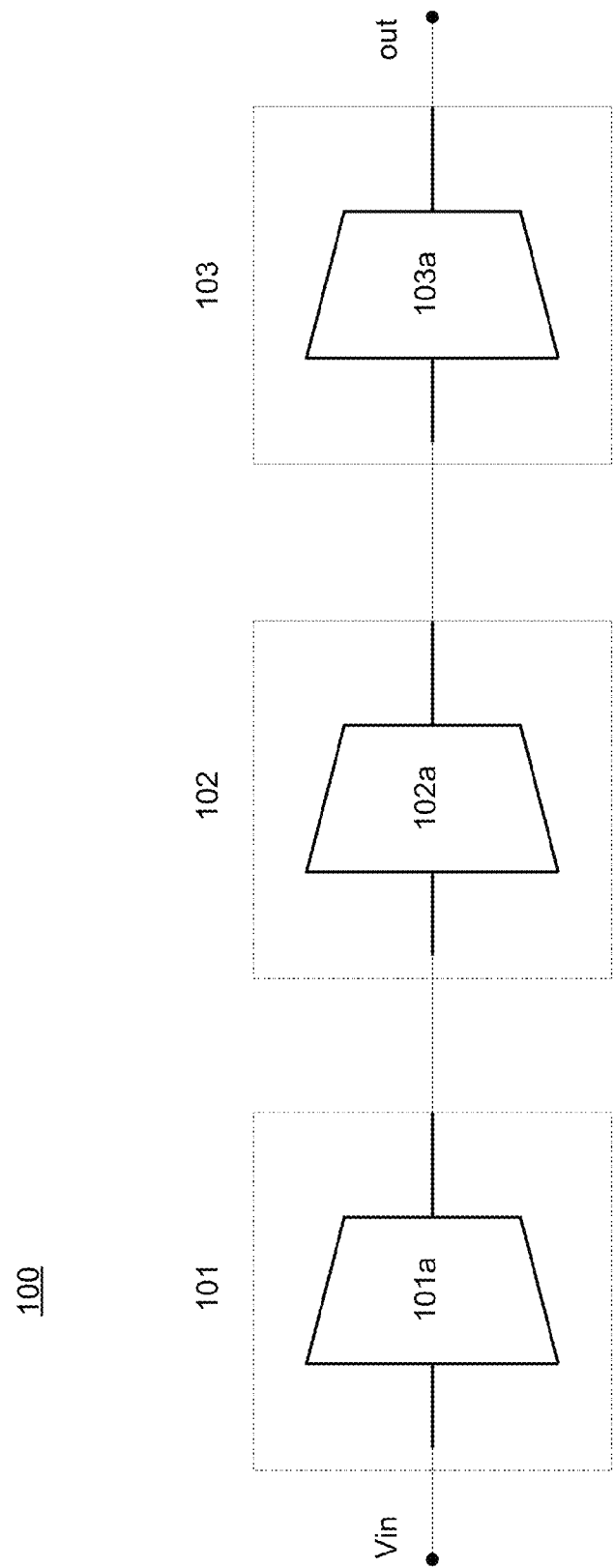
FIG. 1 is a high level block diagram of an exemplary multiple-stage operational amplifier according to some embodiments of the present disclosure.

The present disclosure will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as devices, components, methods or systems. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer, special purpose computer, ASIC, or other programmable data processing apparatus, such that the instructions, which execute via the processor of the computer or other programmable data processing apparatus, implement the functions/ acts specified in the block diagrams or operational block or blocks. In some alternate implementations, the functions/ acts noted in the blocks can occur out of the order noted in the operational illustrations. For example, two blocks shown in succession can in fact be executed substantially concurrently or the blocks can sometimes be executed in the reverse order, depending upon the functionality/acts involved. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the block diagrams or operational block or blocks.

The principles described herein may be embodied in many different forms. By way of background, an operational amplifier (also referred to as "op-amp") is an electronic circuit that amplifies an input signal differentially supplied between a non-inverting and an inverting input terminal to produce an amplified output signal at an output terminal. The op-amp circuit configuration uses a high-gain amplifier whose parameters are determined by external feedback components. The amplifier gain is so high that absence of external feedback, components lead to saturation of amplifier output even in case of slightest input signal. Op-amps oscillate without some form of compensation in their native state, and are very hard to stabilize. Internally compensated op-amps make it easy to use. Unfortunately, internally compensated op-amps forgo a lot of bandwidth and still oscillate under some conditions, so an understanding of compensation is required to apply op-amps. Internal compensation presents a worst-case trade-off between stability and performance. On the other hand, uncompensated op-amps need more attention, but they can do more work. The compensation process provides a less than perfect op-amp or circuit. There are many different problems that can introduce instability, thus there are many different compensation schemes.

Furthermore, op-amps are the most widely used electronic devices today and find applications in a vast array of consumer, industrial, and scientific devices. It is also useful in wireless infrastructures using switchable intermediate frequency (IF) active filter. Switchable IF active filter banks for flexible data-rate control are critical for filtering in the current market because monolithic realization has been challenging due to the necessity for ultra-wideband, high power op-amps to maintain the frequency response accuracy.

For example, multi-path feed-forward op-amp architecture is currently used to provide high loop gain. Such architecture has a plurality of distinct amplification paths in parallel, typically ranging from low order amplification paths to higher order amplification paths. For example, one such architecture may include first, second, and third amplification paths arranged in parallel, the first-order path having a single amplifier, the second-order path having two amplifiers connected in series, and the third-order path having three amplifiers connected in series. Each amplification path typically contributes a different frequency response to the output, and some paths are designed to bypass or feed-forward past other paths at selected frequencies. (Feeding forward introduces extra zeros, thereby compensates the non-dominant poles and enables higher gain at higher frequencies without as much concern over stability.) One advantage of multipath feed-forward operational amplifiers is that they typically provide a higher loop gain in a selected frequency band without a corresponding high unity-gain frequency requirement that typically exists for a single-path architecture achieving the same gain in the selected frequency band. This characteristic often manifests as a steeper loop gain below the unity-gain frequency for multipath feed-forward architectures in comparison to two- or multi-stage single-path architectures. Indeed, for conventional explicit FFC op-amps, the separated Gm-C FFC needs a high transconductance, and hence consumes huge power. Inadequate transconductance leads to potentially unstable op-amps.

However, conventional multipath feed-forward operational amplifiers are inefficient from both chip-area and power-consumption perspectives. The large number of amplifiers required for many different independent amplification paths requires both a large chip area to implement and a large amount power to operate. Another problem with conventional multipath feed-forward architectures is that steeper loop gains below unity-gain frequency and corresponding phase shifts, which are typically associated with these architectures, may provide unintended or unavoidable frequency compensation effects due to the parallel nature of the feed-forward amplification paths, which may again lead back to stability concerns, especially in view of the increased gains achieved by these amplifiers.

Thus, as discussed herein, the present disclosure provides systems implementing an implicit Feed-Forward Compensated (FFC) op-amp, where the main FFC port is realized by the P-side of the CMOS input structure of the second and third stages of the op-amp, while the main signal path is through the N-side. According to some embodiments, to balance the relative strengths of the main path and feed-forward paths, the $2^{nd}$-stage NMOS input pair is split into two pairs, where one pair is used to route the main path while the other pair is used for the auxiliary FFC. The disclosed implicit FCC op-amp is unconditionally stable with adequate phase lead. Indeed, in a practical signal buffer for data converters or RF modulators/demodulators, monolithic IF active filter), sigma-delta modulator and other applications that need a high-gain wideband op-amp, a subset of all the above mentioned techniques can be employed to ensure a good overall performance.

The present disclosure, as discussed in more detail below, provides that the disclosed feed-forward compensation technique for op-amp with split pairs is an efficient technique for achieving high gain and adequate phase margin simultaneously while drawing small current. The present disclosure is applicable for realization of monolithic IF active filter for wireless transceivers, such as base stations, handsets, mobile terminals and point-to-point radio links. Thus, the active filters implemented by the FFC three-stage op-amp discussed herein can replace conventional SAW filter bank modules, as the disclosed applications lead towards decreased consumption and reduced manufacture costs respective the Active filters and other CT analog circuits such as the CT sigma-delta modulators.

Certain embodiments will now be described in greater detail with reference to the figures. FIG. 1 is a high-level block diagram illustrating components of an exemplary multiple-stage operational amplifier (op-amp) 100. Op-amp 100 includes three stages (or orders): 101, 102 and 103, where each stage includes an amplifier 101a, 102a and 103a, respectively. It should be understood that according to some embodiments, the number of stages may vary, as the number of stages may increase or decrease, for example, depending on requirements for gain achievement and/or phase margin, in addition to the amount of current being drawn by the op-amp 100. Embodiments exist where the each respective stage 101-103 can include a plurality of amplifiers connected to form a plurality of different amplification stages from an input terminal IN to an output terminal OUT of the op-amp 100.

FIG. 1 depicts an embodiment of architecture for forming a multi-stage 101-103 feed-forward operational amplifier 100 having improved power consumption properties. Each amplification stage can be partially distinct, partially overlapping and/or partially in parallel with each other. In general, amplifiers 101a, 102a and 103a include parallel NMOS and PMOS input transistors in order for the input (e.g., $V_{IN}$) to swing from rail to rail (i.e., $0_V$ to $V_{DD}$). As discussed in more detail below, the FCC part of op-amp 100 is realized through the P-side of the CMOS input structure of the $2^{nd}$ and $3^{rd}$ stages of the op-amp 100 (i.e., stages 102 and 103, respectively), while the main signal path is through the N-side. Indeed, to balance the relative strengths of the main path and the feed forward path, the $2^{nd}$ stage, stage 102, NMOS input pair is split into two pairs. Here, one pair of the $2^{nd}$ stage is used to route the main path while the other pair is used for auxiliary FFC. This results in adequate phase lead leaving the op-amp unconditionally stable, as discussed in more detail below.

According to some embodiments, the various amplifiers of the amplification stages in FIG. 1 are depicted as being transconductance amplifiers, i.e., voltage-to-current amplifiers. However, any of the amplifiers in amplification paths of embodiments of the multi-stage feed-forward operational amplifiers discussed herein can instead be voltage-to-voltage amplifiers, current-to-current amplifiers, or current-to-voltage amplifiers. Also, the amplifiers and connecting signal paths depicted in FIG. 1 can be represented as single-ended, differential, or partially-single-ended and partially-differential amplifiers and signal paths.

FIGS. 2A-2E depict exemplary embodiments of amplification transistor configurations that can be used to implement the amplifiers of the plurality of amplification stages of the operational amplifiers 100 discussed above. Note that, although FIGS. 2A-2E primarily depict only the amplification transistor configurations of the amplifiers of the plurality of amplification paths, these amplification transistor configurations can typically be used in conjunction with further circuitry of the respective amplifier in which they are included, such as, but not limited to, Continuous-Time Common-Mode Feedback Circuitry (CMFB), common-mode circuitry configured to control DC voltage levels at various amplifier circuit nodes, load transistor configurations connected to the output terminals OUT+, OUT−, current source transistor configurations connected to the output terminals OUT+, OUT−, and other circuit elements.

FIG. 2A depicts a differential pair of NMOS amplification transistors N1, N2, having gates connected to positive and negative input terminals IN+, IN−, drains connected to positive and negative output terminals OUT+, OUT−, and sources connected to a current source I1, which can be implemented using a current-source transistor configuration (not shown). FIG. 2B depicts a pseudo differential pair of NMOS amplification transistors N3, N4, having gates connected to positive and negative input terminals IN+, IN−, drains connected to positive and negative output terminals OUT+, OUT−, and sources connected to a reference voltage, e.g., ground.

FIGS. 2C-2D depict versions of differential pairs similar to those depicted in FIGS. 2A-2B, in which NMOS common-gate amplification transistors N7, N8, N11, N12 can be connected between the output terminals OUT+, OUT− and the drains of NMOS differential pair amplification transistors N5, N6 (connected to a current source I2) or NMOS pseudo differential pair amplification transistors N9, N10. The common-gate amplification transistors N7, N8, N11, N12 can have gates connected to voltage references VREF1, VREF2. Although FIGS. 2A-2D depict amplification transistor configurations having NMOS amplification transistors, corresponding PMOS versions of the amplification transistor configurations can be formed by substituting PMOS transistors for the depicted NMOS transistors, and providing complimentary interconnections appropriate for translating between NMOS and PMOS configurations.

FIG. 2E depicts an embodiment of complementary pseudo pairs of NMOS and PMOS amplification transistors N13, N14, P1, P2, having gates connected to positive and negative input terminals IN+, IN−, drains connected to positive and negative output terminals OUT+, OUT−, and sources connected to fixed voltage sources, e.g., ground or a power supply. According to some embodiments, the gates of the NMOS and PMOS amplification transistors directly connected together can be separated by voltage sources or AC-coupling capacitors.

Turning back to FIG. 1 (and applicable to the discussion of FIGS. 3-4 as discussed below), and based upon the discussion respective FIGS. 2A-2E above, the operational amplifier 100 can be implemented as, but not limited to, fully differential (i.e., having differential signal paths throughout), fully single-ended (i.e., having single-ended signal paths throughout), or partially-differential and partially-single-ended (i.e., having both differential and single-ended paths variously throughout). The amplification transistor configurations of FIGS. 2A-2E, or modifications thereof, can be used to implement any such differential or single-ended embodiments of the operational amplifier 100 (or amplifiers 101a-103a). That is, according to some embodiments, the amplification transistor configurations of FIGS. 2A-2E can be modified to form corresponding single or single-ended amplification transistor configurations by including only the left or right circuit branch in any of the depicted embodiments. In some embodiments, single-ended configurations can also be implemented by connecting one input terminal of the configurations in FIGS. 2A-2E to a fixed voltage, and the output taken from a single one of the output terminals, with or without the other output terminal having its signal referred to such an output terminal. Additionally, in some embodiments, in partially-differential, partially-single-ended embodiments, depending on whether the input or the output is single-ended or differential, one input can be connected to a fixed voltage, and the output can be taken from both output terminals, or both inputs can be used and the output taken from a single one of the output terminals (with or without the other output terminal having its signal referred to the utilized output terminal).

As discussed above, and in more detail below, the amplifiers of the plurality of amplification stages 101-103 of the multi-stage FFC op-amp 100 can include, in addition to at least one amplification transistor or amplification transistor pair, further circuitry such as, but not limited to, Continuous-Time Common-Mode Feedback Circuitry (CMFB), common-mode circuitry configured to control DC voltage levels at various amplifier circuit nodes, load transistor configurations, current source transistor configurations, and other circuit elements. Also, the amplification transistor configurations of FIGS. 2A-2E can be used to implement amplifiers that voltage-to-voltage, current-to-current, voltage-to-current, or current-to-voltage amplifiers.

Figure 3:
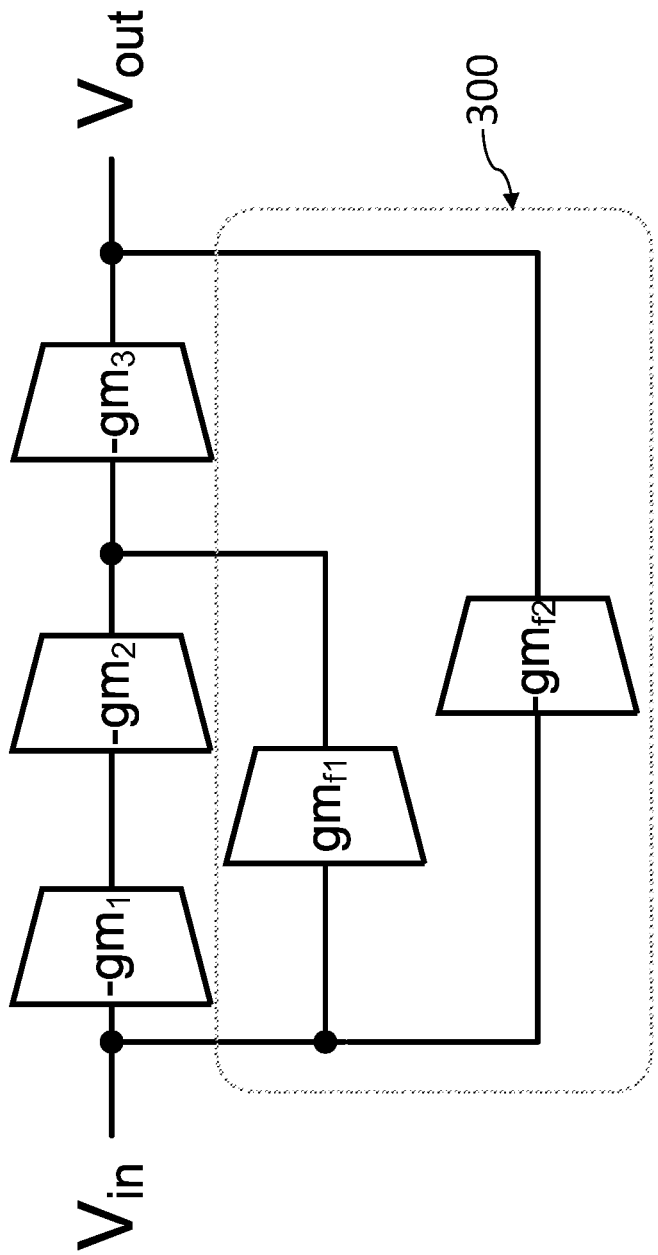
FIG. 3 illustrates a schematic of a 3-stage feed-forward compensated op-amp according to some embodiments of the present disclosure.

Based on the above discussion, FIG. 3 illustrates a schematic view of a 3-stage feed-forward op-amp according to an embodiment of the present disclosure. As illustrated in FIG. 3, the main path is composed of 3 stages in series: gm1, gm2 and gm3. It should be understood that embodiments may exist where the feed-forward op-amp may comprise more or less stages, and in line with such embodiments, fewer or greater number of stages may be included in such design within the scope of the present disclosure. The feed-forward path 300 is composed of $gm_{f1}$ and $gm_{f2}$. Again it should be understood that embodiments can exist where there may be additional components making up the feed-forward path 300; for example: $gm_{f3}$ (not shown)—as understood by those of skill in the art. The feed-forward path 300 is used to create a faster path in order to compensate the phase degradation.

According to some embodiments, the signals and terminals of the op-amp stages illustrated in FIG. 3 are illustrated as single ended; however, it should not be construed as limiting, as embodiments exist where such signals and terminals can be differential or partially single-ended and partially differential, or some combination thereof, according to particular realizations.

Figure 4:
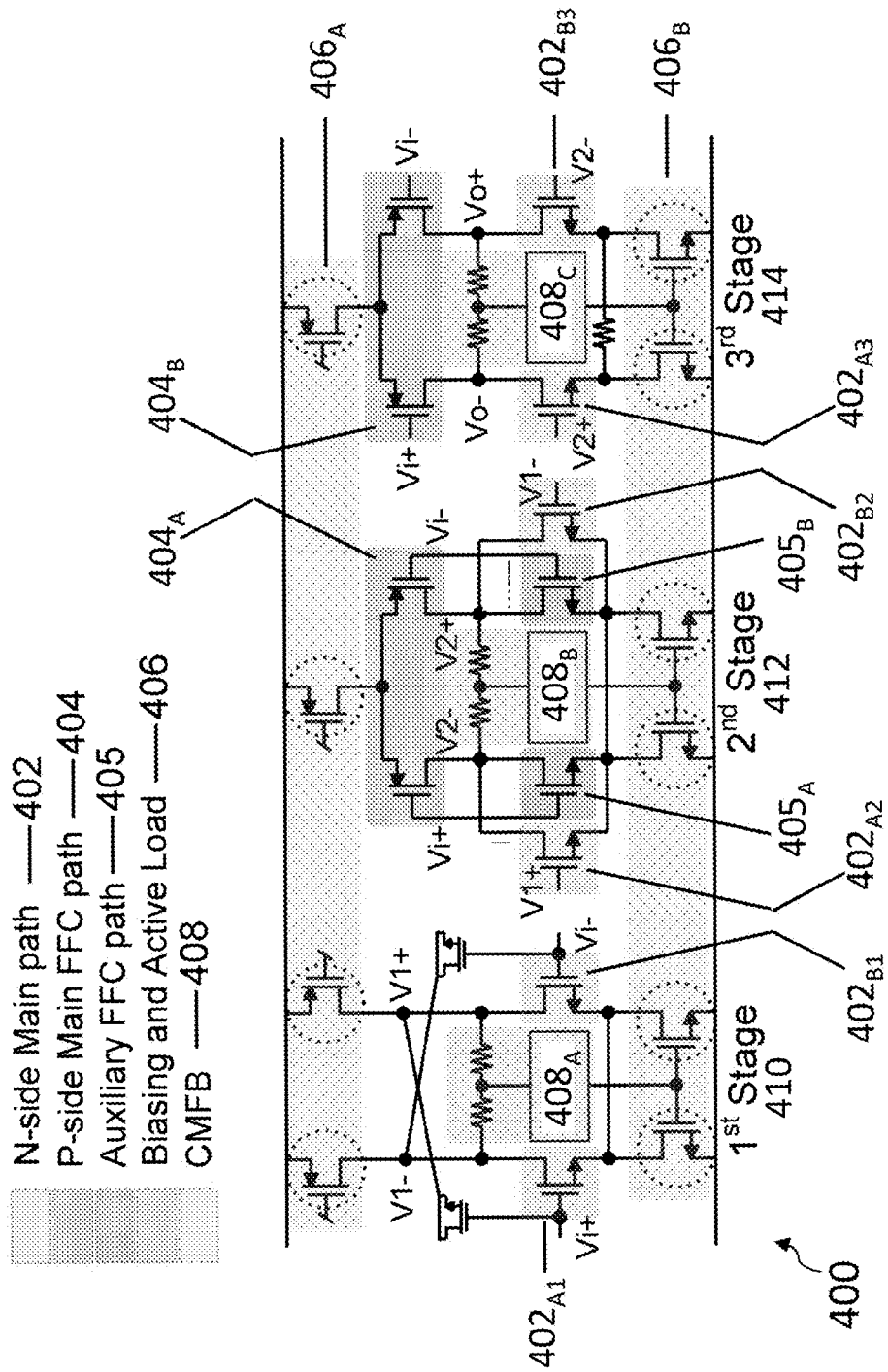
FIG. 4 illustrates an implicit FCC op-amp with split pairs according to some embodiments of the present disclosure.

According to some embodiments, for concrete realization, an implicit feed-forward compensation (FFC) scheme can be employed as shown in this FIG. 4. As illustrated in FIG. 4, the op-amp 400 is comprised of 3 stages: the first stage 410, second stage 412 and the third stage 414. (Note, stages 410, 412 and 414 can involve the discussion above from FIG. 1 respective stages 101-103). According to some embodiments, the first stage 410 drives the second stage 412, which in turn drives the third stage 414. However, embodiments exist where the first stage 410 can drive the third stage 414. It should be understood that the input can be driven in any order within op-amp 400. Stages 410, 412, and 414 are connected in series and parallel. In some embodiments, the disclosed op-amp 400 utilizes existing circuitry structure by coupling input from, for example, the first stage 410 not to the immediate second stage 412, but to the third stage 414—the output stage. Here, stages 410 and 414 pull in parallel, while stage 410, 412 and 414 are driven in a row (e.g., series). Thus an all feed-forward amplifier 400 is created that has a stabilized frequency response.

As understood by those of skill in the art, certain transistors, as discussed herein, may be coupled via resistors R. A resistor may be any electronic component that produces a voltage across its terminals that is proportional to the electric current passing through it in accordance with Ohm's law. In operation of op-amp 400, as depicted in FIG. 4 and understood by those of skill in the art, some resistors R may convert a voltage output by one transistor to a current to be input to another transistor. In addition, some resistors may be used to sense the common-mode output voltage and stabilize the common-mode signals of op-amp 400 or of a stage 410, 412, or 414 of the op-amp 400.

The op-amp 400 further includes an N-side main path 402 (having split pair $402_{A1}$ and $402_{B1}$ in $1^{st}$ stage 410, having split pair $402_{A2}$ and $402_{B2}$ in $2^{nd}$ stage 412, and split pair $402_{A3}$ and $402_{B3}$ in $3^{rd}$ stage 414), p-side FFC path 404 (having P-side $404_A$ in $2^{nd}$ stage 412 and P-side $404_B$ in $3^{rd}$ stage 414), an auxiliary FFC path 405 (having split pair $405_A$ and $405_B$ in $2^{nd}$ stage 412), a biasing and active load 406 (having bias and active load $406_A$ and bias and active load 4060, and CMFB 408 (having CMFB $408_A$ in $1^{st}$ stage 410, CMFB $408_B$ in $2^{nd}$ stage 412, and CMFB $408_C$ in $3^{rd}$ stage 414). As illustrated in FIG. 4, each stage of the op-amp 400 involves components of main path 402 (split pair $402_{A1}$ and $402_{B1}$ in $1^{st}$ stage 410, split pair $402_{A2}$ and $402_{B2}$ in $2^{nd}$ stage 412, and split pair $402_{A3}$ and $402_{B3}$ in $3^{rd}$ stage 414), biasing and active load 406 (bias and active load $406_A$ and bias and active load $406_B$, and CMFB 408 (CMFB $408_A$ in $1^{st}$ stage 410, CMFB $408_B$ in $2^{nd}$ stage 412, and CMFB $408_C$ in $3^{rd}$ stage 414). Stages 412 and 414 further include components of p-side FFC path 404 (P-side $404_A$ in $2^{nd}$ stage 412 and P-side $404_B$ in $3^{rd}$ stage 414) and auxiliary FFC path 405 (split pair $405_A$ and $405_B$ in $2^{nd}$ stage 412), as discussed herein. More specifically, the main FFC path 404 is realized by the P-side 404 of the CMOS-input structure of the $2^{nd}$ stage 412 and $3^{rd}$ stage 414 of the op-amp 400 (utilizing P-side $404_A$ in $2^{nd}$ stage 412 and P-side $404_B$ in $3^{rd}$ stage 414, respectively), while the main signal path is routed through the N-side main path 402 (utilizing split pair $402_{A1}$ and $402_{B1}$ in $1^{st}$ stage 410, having split pair $402_{A2}$ and $402_{B2}$ in $2^{nd}$ stage 412, and split pair $402_{A3}$ and $402_{B3}$ in $3^{rd}$ stage 414, respectively in the stages). As a result, the FFC does not add any extra capacitance and the power overhead is zero due to the current reuse. To fine-tune the relative strengths of the main signal path and the feed-forward path, the second stage NMOS input pair is split into two pairs, one (split pair $402_{A2}$ and $402_{B2}$) is used to route the main path 402 while the other (split pair $405_A$ and $405_B$ in $2^{nd}$ stage 412) is used for auxiliary FFC path 405. Each part is marked accordingly in FIG. 4.

Furthermore, based on the above discussion of FIGS. 3 and 4, each embodiment discussed herein involves an implicit FCC op-amp with split pairs. FIG. 4 depicts a connection, in series and parallel, of op-amps implementing an implicit feed-forward technique with split pairs to achieve high gain and adequate phase margin simultaneously while drawing small current. Thus, FIG. 4 depicts, according to some embodiments, a wide-band op-amp that can be used in highly linear applications operating at intermediate frequency (IF), such as, but not limited to, signal buffers for high-performance data converters or radio-frequency (RF) modulators and demodulators, continuous-time (CT) filters or sigma-delta data converters (e.g., delta sigma modulation for encoding analog signals to digital signals).

According to some embodiments, the FFC op-amp 400 can be used in IF active filter for wireless infrastructures. As discussed herein, the op-amp significantly decreases the power consumption of IF active-RC filters or sigma-delta modulators. The op-amp 400 also decreases the manufacturing costs of IF active-RC filters or sigma-delta modulators. As illustrated in FIG. 4, in accordance with some embodiments, the FCC op-amp 400 can realize a gain over 50 dB at DC and over 40 dB at 400 MHZ while drawing 2.8 mA at 1.5V in a 40 nm CMOS process. The disclosed op-amp is unconditionally stable with a minimum phase lead larger than 42 degrees under different process corners in that 40 nm CMOS process. Higher bandwidth and gain can be achieved by the disclosed op-amp by increasing the supply voltage without degrading the circuit reliability.

Figure 5:
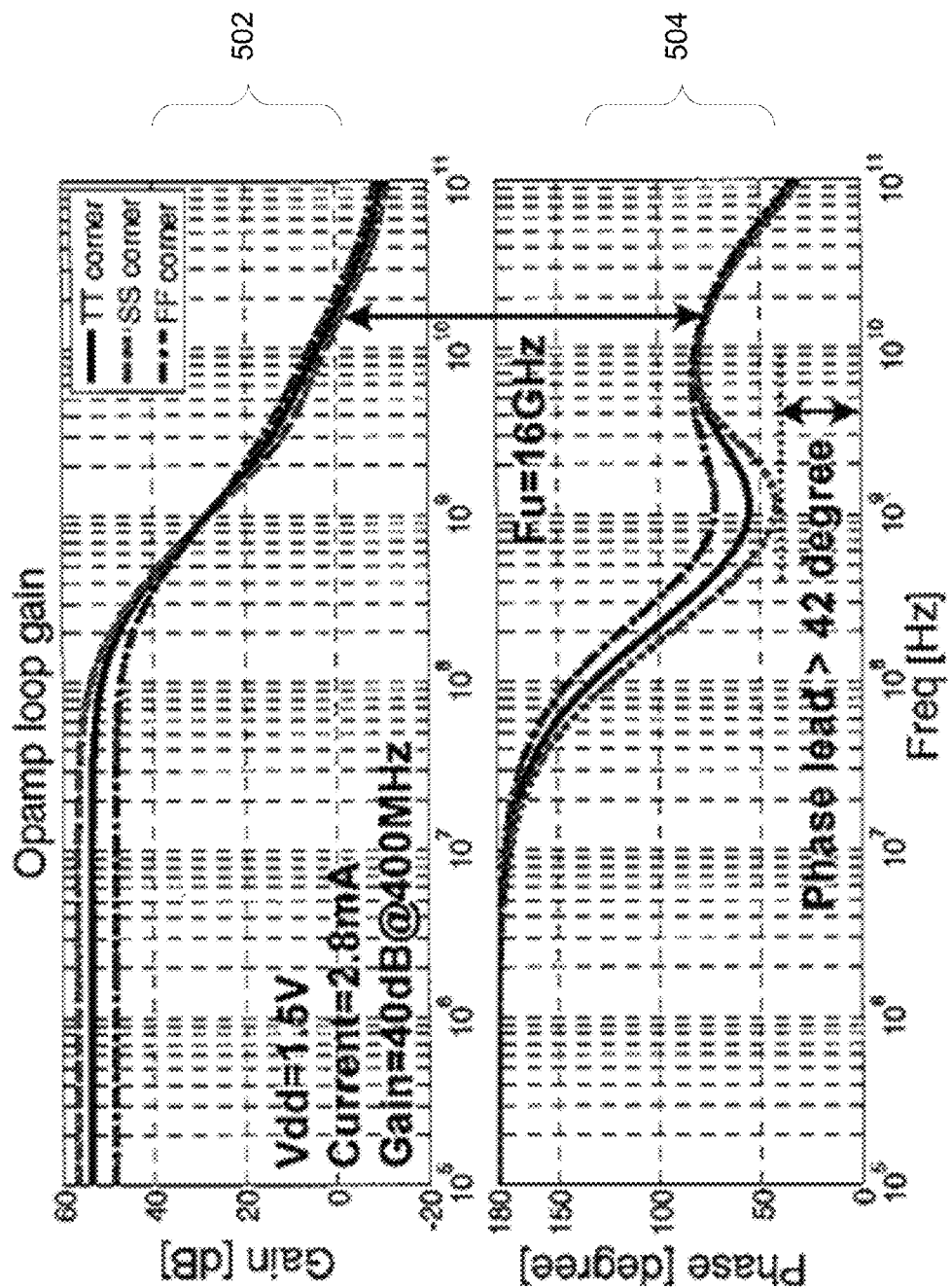
FIG. 5 depicts simulation results of a Bode plot of the implicit FCC three-stage op-amp illustrated in FIGS. 3-4, according to some embodiments of the present disclosure.

The wideband three-stage FFC op-amp 400 illustrated in FIG. 4 can also be employed in this design to further improve Transfer Function (TF) accuracy (of an active-RC filter) as well as the linearity. The current-reusing implicit FFC scheme is shown in FIG. 4, in which the P-sides (of p-side FFC path 404) of the CMOS-input structures of the $2^{nd}$ stage 412 (P-side 404$_A$) and $3^{rd}$ stage 414 (P-side 404$_B$) realize the feed-forward paths, while the cascaded gain path is routed through the N-side main path 402. The N-side 402 input of the $2^{nd}$ stage 412 is further split into two parts (as per FIG. 4, the first part is split pair 402$_{A2}$ and 402$_{B2}$ and the second part is split pair 405$_A$ and 405$_B$) to fine-tune the relative strength between the main and the feed-forward paths, which improves the stability of the structure without adding an additional parasitic. As illustrated in chart 502 of FIG. 5, 1.5V supply is used to boost the linearity of the op-amp by implementing the tail current sources and active loads (bias and active loads 406$_A$ and 406$_B$ in FIG. 4) using 2.5V I/O transistors.

Thus, the present disclosure, according to some embodiments, involves an implicit FFC technique with split pairs that is applied with op-amps to achieve high gain and adequate phase margin simultaneously while drawing small current. As discussed above in addition to varying advantages and embodiments, the present disclosure is applicable for realization of monolithic active filters for wireless transceivers, such as base stations and point-to-point radio links, among other devices, configurations and environments.

For the purposes of this disclosure a module is a software, hardware, or firmware (or combinations thereof) system, process or functionality, or component thereof, that performs or facilitates the processes, features, and/or functions described herein (with or without human interaction or augmentation).

Those skilled in the art will recognize that the systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments presented and described in this disclosure are provided by way of example in order to provide a more complete understanding of the technology. The disclosure is not limited to the operations any logical flow or presentation presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. An implicit feed-forward compensated (FFC) operational amplifier comprising:
   (a) a first stage comprising a first amplifier, said first amplifier connected to a bias and active load and comprising a first Common Mode Feedback Circuitry (CMFB), said first stage comprising an NMOS input transistor for an input and output;
   (b) a second stage comprising a second amplifier, said second amplifier connected to said bias and active load and comprising a second CMFB, said second stage comprising a NMOS split pair and PMOS input transistor for an input and output, wherein
      (i) the NMOS split pair comprises a first split pair and a second split pair,
      (ii) the first split pair is utilized to route a main path, and
      (iii) the second split pair is utilized to route an FFC path; and
   (c) a third stage comprising a third amplifier, said third amplifier connected to said bias and active load and comprising a third CMFB, said third stage comprising a parallel NMOS and PMOS input transistors for an input and output, wherein
      (i) said first stage, second stage and third stage are connected.

2. The implicit FFC operational amplifier of claim 1, wherein said first stage is the input stage and the third stage is the output stage.

3. The implicit FFC operational amplifier of claim 1, wherein the first stage and the third stage pull in parallel, while the first, second and third stage are driven in series, wherein the main path comprises driving the three stages in series through the NMOS of each stage, and wherein the FFC path is realized through the PMOS of the second stage and the third stage.

4. The implicit FFC operational amplifier of claim 1, wherein said main path is a cascaded path through the N-side of each stage.

5. The implicit FFC operational amplifier of claim 1, wherein each stage comprises a plurality of amplifiers.

6. An operational amplifier comprising:
   (a) a plurality of amplifiers corresponding to a CMOS input structure, said plurality of amplifiers connected with each other to form a plurality of stages comprising a plurality of distinct amplification paths, wherein at least one stage comprises a main path and at least one stage comprises a feed-forward compensation (FFC) scheme,
(b) said main path comprising at least three of the plurality stages in series, wherein the main path is realized through the N-side of the CMOS input structure of each stage in the main path; and
(c) the FFC scheme comprising at least two of the plurality of stages in parallel, wherein
  (i) the P-side of the CMOS input structure of said stages realize a FFC path and,
  (ii) part of the N-side of the CMOS input structure of at least one of said stages is utilized to route the FFC path.

7. The operational amplifier of claim 6, wherein the main path is comprised of three stages, wherein said three stages are in series.

8. An operational amplifier comprising
(a) a plurality of amplifiers corresponding to a CMOS input structure, said plurality of amplifiers connected with each other to form a plurality of stages comprising a plurality of distinct amplification paths, wherein at least one stage comprises a main path and at least one stage comprises a feed-forward compensation (FFC) scheme,
(b) said main path comprising at least three of the plurality stages in series, wherein the main path is realized through the N-side of the CMOS input structure of each stage in the main path;
(c) the FFC scheme comprising at least two of the plurality of stages in parallel, wherein the P-side of the CMOS input structure of said stages realize a FFC path; and
(d) wherein the plurality of amplifiers are connected to form three stages comprising first stage, a second stage and a third stage, wherein said first stage is the input stage and the third stage is the output stage.

9. The operational amplifier of claim 8, wherein a configuration of the operational amplifier comprising the first stage and the third stage pull in parallel, while the first, second and third stage are driven in series.

10. The operational amplifier of claim 9, wherein said configuration results in stabilized frequency response.

11. The operational amplifier of claim 8, wherein the first stage, second stage and third stage are connected in series, and said second and third stages are also connected in parallel.

12. The operational amplifier of claim 8, wherein the second stage NMOS input pair comprises two split pairs, wherein a first pair is utilized to route the main path and the second pair is utilized to route the FFC path.

13. The operational amplifier of claim 12, wherein said main path is a cascaded path though the N-side of each stage.

14. The operational amplifier of claim 12, wherein said split pairs fine tunes the relative strength between the main path and the FFC path, said fine-tuning comprising improving stability of the CMOS input structure of said operational amplifier without adding additional parasitics.

15. The operational amplifier of claim 8, wherein the main FFC scheme is realized through the P-side of the second stage and the third stage and the FFC path is realized through one split path of the second stage.

16. The operational amplifier of claim 6, further comprising:
  Common Mode Feedback Circuitry (CMFB), wherein each stages comprises CMFB, and wherein each of said CMFB is a continuous time circuit; and
  a biasing and active load, wherein each stage is connected to said loads from rail-to-rail.

17. The operational amplifier of claim 6, wherein said FFC scheme improves Transfer Function accuracy and linearity.

* * * * *